(12) United States Patent
Chen et al.

(10) Patent No.: US 9,468,127 B2
(45) Date of Patent: Oct. 11, 2016

(54) SERVER CHASSIS CAPABLE OF ACCESSING AND ROTATING STORAGE DEVICES ACCOMMODATED THEREIN

(71) Applicant: Super Micro Computer Inc., San Jose, CA (US)

(72) Inventors: Richard S. Chen, San Jose, CA (US); Chaoching Wu, San Jose, CA (US)

(73) Assignee: SUPER MICRO COMPUTER INC., San Jose, CA (US)

( * ) Notice: Subject to any disclaimer, the term of this patent is extended or adjusted under 35 U.S.C. 154(b) by 53 days.

(21) Appl. No.: 14/552,647

(22) Filed: Nov. 25, 2014

(65) Prior Publication Data

US 2015/0342080 A1 Nov. 26, 2015

(30) Foreign Application Priority Data

May 22, 2014 (TW) .............................. 103208967 U

(51) Int. Cl.
| | | |
|---|---|---|
| H05K 7/00 | (2006.01) | |
| H05K 7/14 | (2006.01) | |
| H05K 7/20 | (2006.01) | |
| G11B 33/12 | (2006.01) | |

(52) U.S. Cl.
CPC ........... H05K 7/1489 (2013.01); G11B 33/128 (2013.01); H05K 7/1487 (2013.01); H05K 7/1491 (2013.01); H05K 7/1492 (2013.01); H05K 7/20736 (2013.01)

(58) Field of Classification Search
None
See application file for complete search history.

(56) References Cited

U.S. PATENT DOCUMENTS

| | | | | |
|---|---|---|---|---|
| 5,515,515 A | * | 5/1996 | Kennedy ............. | G06F 13/4081 361/679.02 |
| 9,179,573 B1 | * | 11/2015 | Lundquist ................ | H05K 7/14 |
| 2005/0286235 A1 | * | 12/2005 | Randall ................ | H05K 7/1492 361/724 |
| 2008/0130219 A1 | * | 6/2008 | Rabinovitz .......... | G11B 25/043 361/679.31 |
| 2010/0007252 A1 | * | 1/2010 | Liu ....................... | H05K 7/1487 312/223.2 |
| 2011/0248612 A1 | * | 10/2011 | Peng ....................... | G06F 1/181 312/326 |
| 2011/0279973 A1 | * | 11/2011 | Terwilliger .......... | H05K 7/1489 361/679.58 |
| 2012/0020016 A1 | * | 1/2012 | Cheng ..................... | G06F 1/184 361/679.48 |
| 2012/0069514 A1 | * | 3/2012 | Ross ................... | H05K 7/20727 361/679.33 |
| 2012/0134099 A1 | * | 5/2012 | Zhang ..................... | G06F 1/184 361/679.37 |
| 2012/0170175 A1 | * | 7/2012 | Silberbauer .......... | H05K 7/1432 361/637 |
| 2012/0201003 A1 | * | 8/2012 | Shimasaki ......... | H05K 7/20736 361/695 |
| 2014/0021836 A1 | * | 1/2014 | Hou ....................... | G11B 33/02 312/223.2 |
| 2015/0062798 A1 | * | 3/2015 | Kannler .................... | G06F 1/20 361/679.32 |
| 2015/0077923 A1 | * | 3/2015 | Rauline ................ | H05K 7/1489 361/679.39 |

* cited by examiner

*Primary Examiner* — Courtney Smith
*Assistant Examiner* — Rashen E Morrison
(74) *Attorney, Agent, or Firm* — Chun-Ming Shih; HDLS IPR Services

(57) ABSTRACT

A server chassis includes a casing, a motherboard, a rotatable rack and an electronic device. The rotatable rack is axially disposed inside the casing and able to rotate with respect to the casing. The rotatable rack has a plurality of insertion spaces. The electronic device is provided on one side of the rotatable rack, and a cord passage is provided between the fan module and the electronic device. The storage devices accommodated in the rotatable rack is electrically connected to the motherboard via the cord passage, thereby increasing the quantity of the storage devices and decreasing the length of the casing.

10 Claims, 10 Drawing Sheets

SERVER CHASSIS CAPABLE OF ACCESSING AND ROTATING STORAGE DEVICES ACCOMMODATED THEREIN

BACKGROUND

1. Technical Field

The present invention relates to a server, particularly to a server chassis capable of accessing and rotating storage devices accommodated therein.

2. Related Art

The conventional server system mainly has electronic components such as the motherboard, the storage devices, or the power supply installed in the casing, and the interior space of the casing is usually divided into a plurality of insertion spaces which are provided to accommodate multiple storage devices arranged in an array. The most common storage device includes a hard disk drive or a solid state drive, etc. However, due to the demand of calculation ability and massive data storage, the server needs to accommodate more storage devices in a very limited casing space. Therefore, the size of the server casing also needs to be change correspondingly.

However, since the user needs to change or replace the storage devices in the server, the server casing needs to reserve sufficient space for replacing or accessing the storage devices. Therefore, if the interior of the casing of the server is provided with storage devices arranged side by side, the length of the casing also needs to be elongated, which increases the space occupied by the server system and causes inconvenience to the user.

BRIEF SUMMARY

The present invention provides a server chassis capable of accessing and rotating the storage devices accommodated therein. The rotatable rack can rotate with respect to the casing to obliquely access the storage devices, thereby achieving the goal of increasing the quantity of the storage devices while decreasing the length of the casing.

The server chassis includes a casing, a motherboard, a rotatable rack, a fan module, and an electronic device. The casing includes an accommodating space. The motherboard is disposed in the accommodating space. The rotatable rack is also disposed in the accommodating space and able to rotate with respect to the casing. The rotatable rack has a plurality of insertion spaces for accommodating the storage devices. The fan module is disposed in the accommodating space and electrically connected to the motherboard. The fan module is disposed on one side of the rotatable rack. The electronic device is disposed in the accommodating space and electrically connected to the motherboard. The electronic device is adjacent to the fan module and disposed on one side of the rotatable rack, and a cord passage is provided between the electronic device and the fan module. The storage devices disposed in the rotatable rack are electrically connected to the motherboard via the cord passage.

The present invention also provides another server chassis capable of accessing and rotating the storage devices, and the input/output backplane of the rotatable rack has power supply port. The power supply port and the power supply module are disposed on the same side of the casing, thereby shortening the distance between the power supply port and the power supply module.

Compared to the conventional technique, the server chassis of the present invention includes rotatable racks axially disposed in the casing and rotatable with respect to the casing. By the rotation of the rotatable rack, the storage devices can be obliquely pulled out or inserted into the rotatable rack, thereby shortening the length of the casing, and also minimizing the space occupied by the server system. Through this arrangement, practicality and flexibility for using can be achieved.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Figure 1:
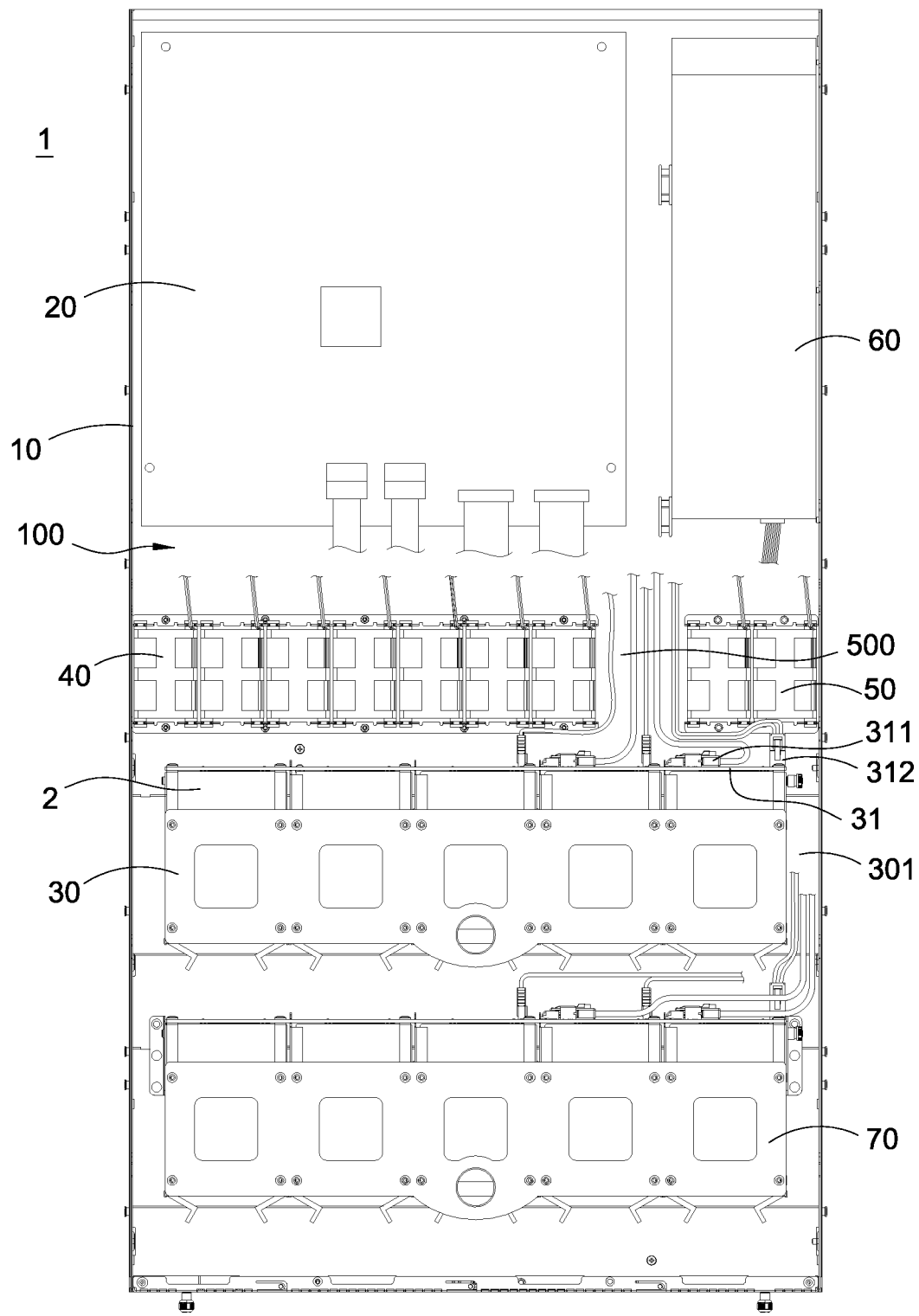
FIG. 1 is a schematic plan view of the server chassis accommodating rotatable and accessible storage devices according to the present invention.
Figure 2:
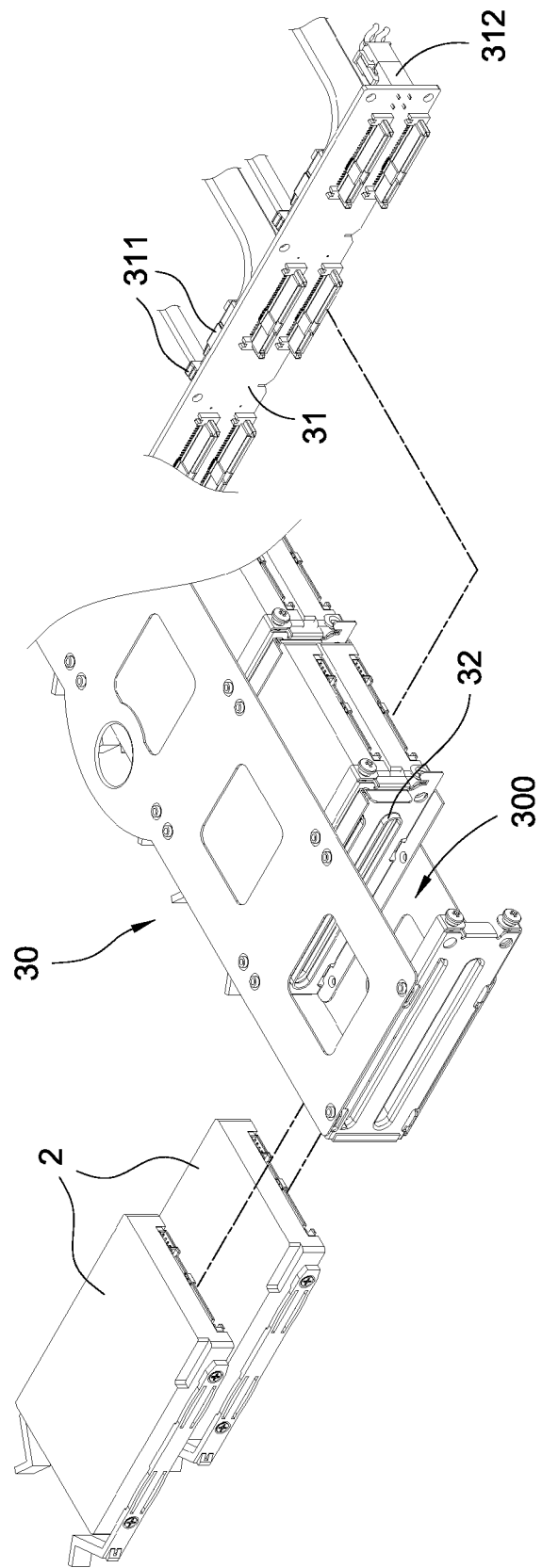
FIG. 2 is an assembled schematic view of the rotatable rack and the storage devices according to the present invention.

Please refer to FIG. 1. The server chassis 1 of the present invention includes a casing 10, a motherboard 20, a rotatable rack 30, a fan module 40, and an electronic device 50. The motherboard 20, the rotatable rack 30, the fan module 40, and the electronic device 50 are disposed inside the casing 10. The rotatable rack 30 is able to rotate with respect to the casing 10. In the present embodiment, the electronic device 50 is replaced with another fan module.

The casing 10 includes an accommodating space 100, and the motherboard 20 is disposed in the accommodating space 100. The rotatable rack 30 is axially disposed in the accommodating space 100 and able to rotate with respect to the casing 10. The fan module 40 is disposed in the accommodating space 100 and electrically connected to the motherboard 20. In the present embodiment, the fan module 40 is disposed on one side of the rotatable rack 30 (back of the rotatable rack 30, near mother board 20). Additionally, the electronic device 50 is disposed in the accommodating space 100 and electrically connected to the motherboard 20. The electronic device 50 is adjacent to the fan module 40 and disposed on a side of the rotatable rack 30. A cord passage 500 is provided between the fan module 40 and the electronic device 50. A storage device 2 (such as hard disk drive or solid state drive) is disposed in the rotatable rack 30. The rotatable rack 30 is provided to accommodate a plurality of storage devices 2, and the storage devices 2 disposed in the rotatable rack 30 are electrically connected to the motherboard 10 via the cord passage 500.

In one embodiment of the present invention, the server chassis 1 further includes a power supply module 60 and a second rotatable rack 70. The power supply module 60 is disposed in the accommodating space 100 and on a side of the motherboard 10. The power supply module 60 is electrically connected to the motherboard 20. A second passage 301 is provided between one side of the rotatable rack 30 and the interior wall of the casing 10. The second passage 301 is disposed on the same side of the casing 10 with respect to the power supply module 60.

The second rotatable rack 70 is provided on a side of the rotatable rack 30 away from the fan module 40, and the second rotatable rack 30 is electrically connected to the motherboard 20 via the second passage 301 and the cord passage 500. Additionally, the rotatable rack 30 further includes an input/output backplane 31, and the input/output backplane 31 includes a plurality of data transferring ports 311 and a power supply port 312. The power supply port 312 is disposed in the same side of the casing 10 with respect to the power supply module 60. The power supply port 312 can be electrically connected to the motherboard 20 via the cord passage 500, thereby shortening the distance between the power supply port 312 and the power supply module 60.

Please further refer to FIGS. 2 to 5. In the present embodiment, the rotatable rack 30 has a plurality of insertion space 300 for accommodating the storage devices 2. Additionally, the rotatable rack 30 includes a plurality of sliding tracks 32, and the insertion spaces 300 in the rotatable rack 30 are divided into upper layer and lower layer parallel to the upper layer by the sliding by the sliding tracks 32.

Figure 3:
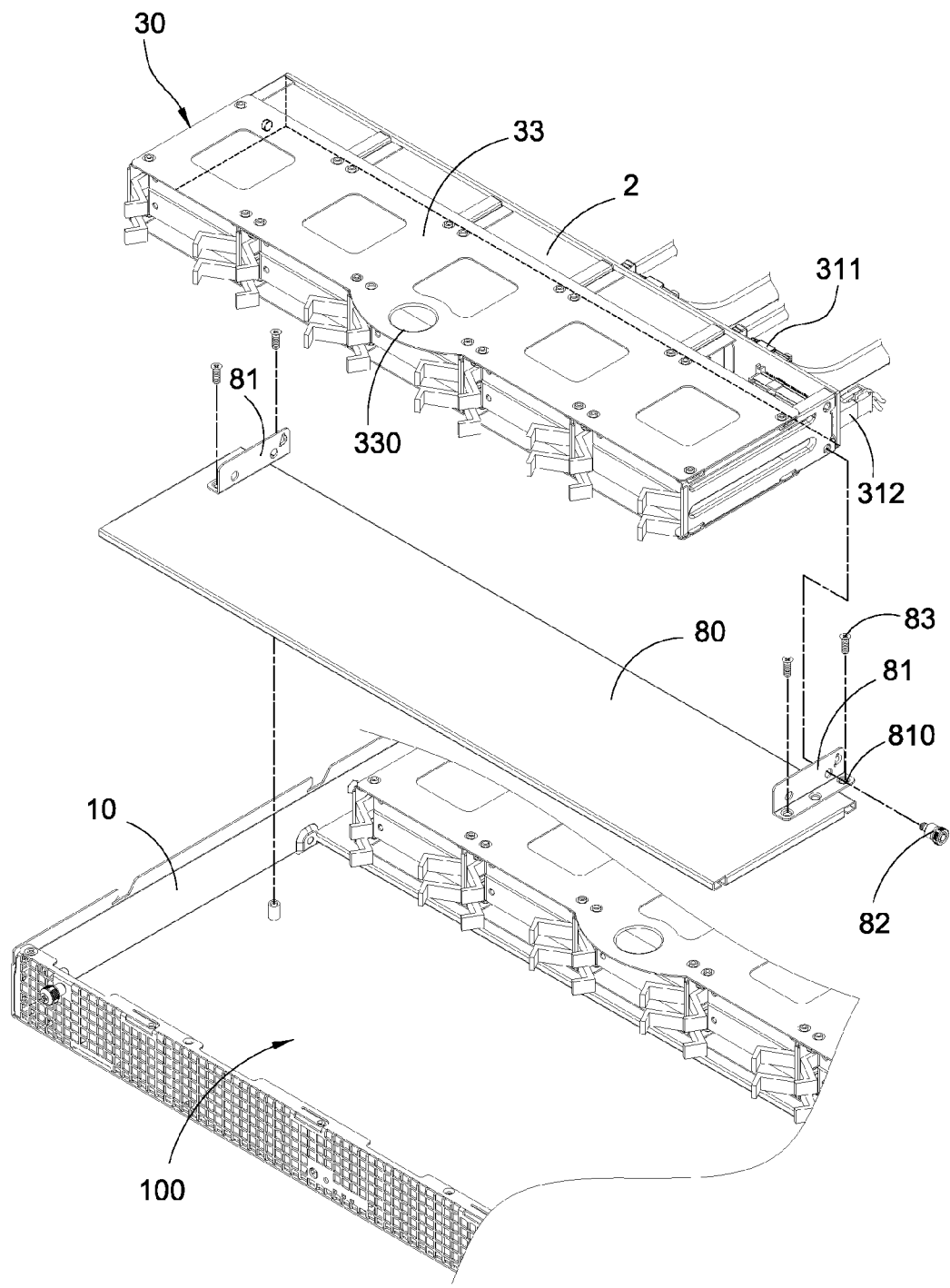
FIG. 3 is an assembled schematic view of the rotatable rack according to the present invention.
Figure 4:
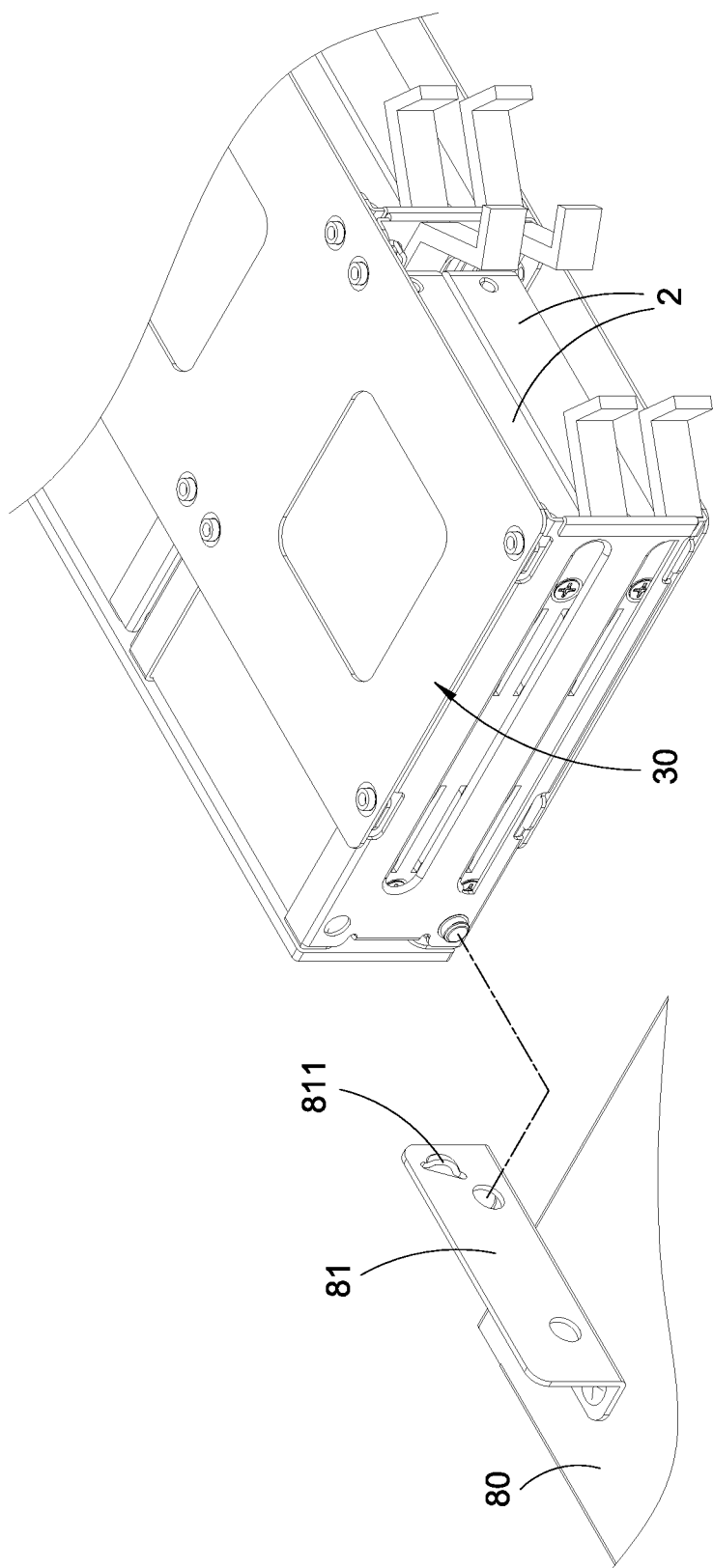
FIG. 4 is a schematic view of the pivotal connection of the rotatable rack.

As embodied in FIGS. 3 and 4, the server chassis 1 further includes a bottom plate 80 disposed on the bottom of the rotatable rack 30, a plurality of support gussets 81 disposed on the bottom plate 80 and a plurality of rotation axis 82. The rotatable rack 30 is axially disposed on the support gussets 81 by the rotation axes 82. The rotation axes 82 can be damping type rotation axes, but not limited thereto.

More specifically, each support gusset 81 is provided with a fixing hole 810, and the bottom plate 80 is fixed inside the casing 10 by fixing a plurality of locking members 83 through the fixing holes 810. In other words, the bottom plate 80 and the rotatable rack 30 disposed thereon can be detached when the locking members 83 are detached from the support gusset 81.

Moreover, in the present embodiment, the rotatable rack 30 includes a cover plate 33, and the cover plate 33 is provided with a holding hole 330. The holding hole 330 is provided for user inserting the finger through the holding hole 330 to lift the rotatable rack 30.

Figure 5:
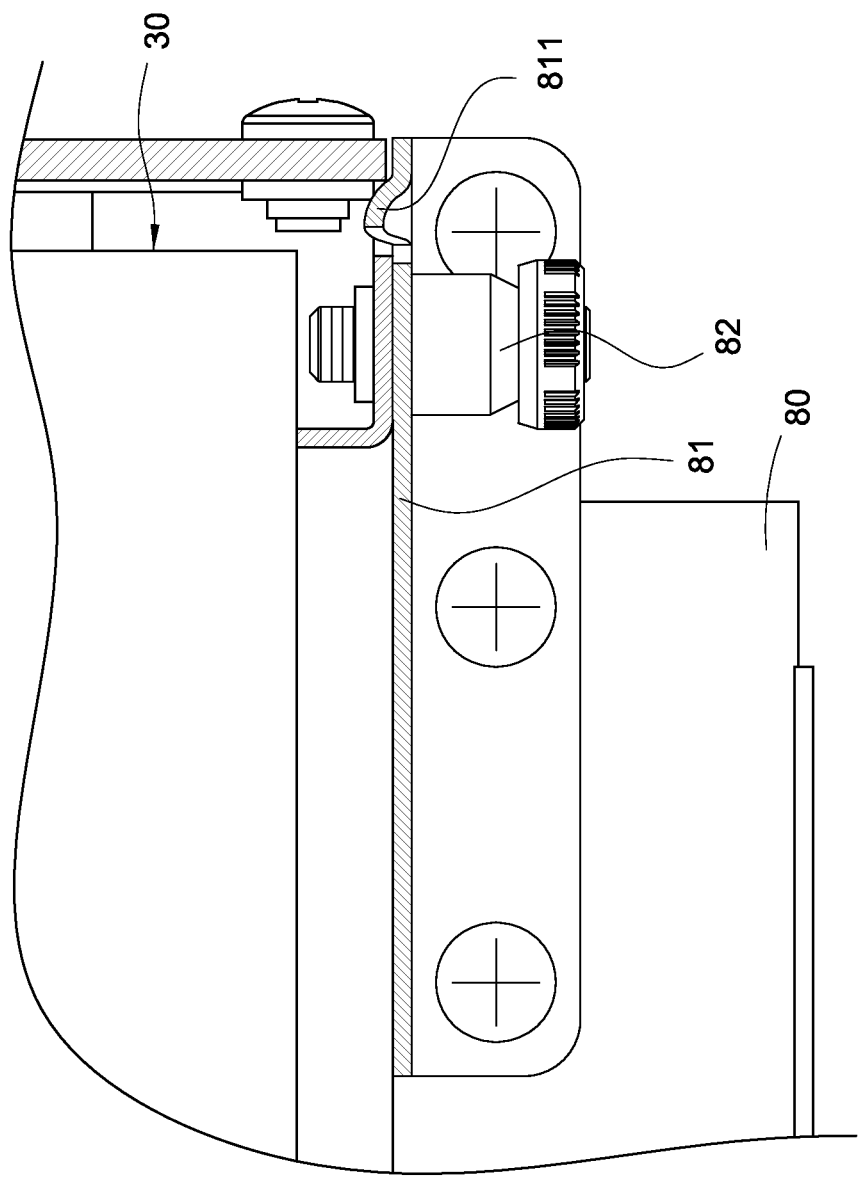
FIG. 5 is a partial cross sectional view of the server chassis according to the present invention.

Please refer to FIG. 5, preferably, the support gusset 81 which is axially connected to the rotatable rack 30 has a block 811. The rotation of the rotatable rack 30 can be stopped by the block 811, so as to prevent over rotation that might touch the data transferring port 311 and the power supply port 312 (refer to FIGS. 2 and 3) to cause bad electrical connection.

Figure 6:
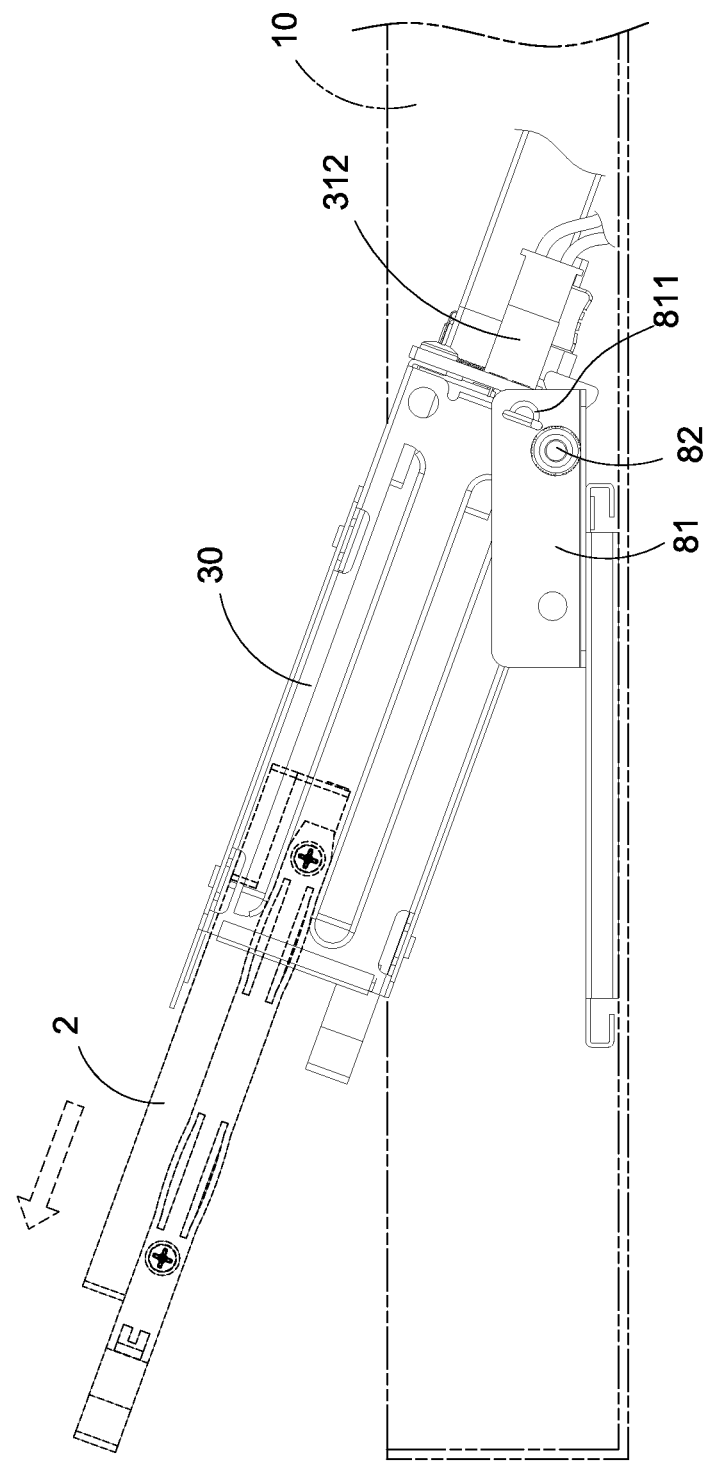
FIG. 6 is a schematic view of using the server chassis having the rotatable and accessible storage devices according to the present invention.

Please refer to FIG. 6. When the server chassis 1 of the present invention is in use, the storage devices 2 are arranged in the rotatable racks 30, respectively. When the user wants to take out the storage devices 2, the user can insert their finger into the holding hole 330 of the cover plate 33 to lift the rotatable rack 30 rotationally by single hand. Meanwhile, the other hand can pull out the storage devices 2 from the rotatable rack 30. By this arrangement, the storage devices 2 can be obliquely pulled out from the rotatable rack 30 by rotating the rotatable rack 30, thereby achieving the goal of reducing the space which is needed to take out the storage devices 2.

Figure 7:
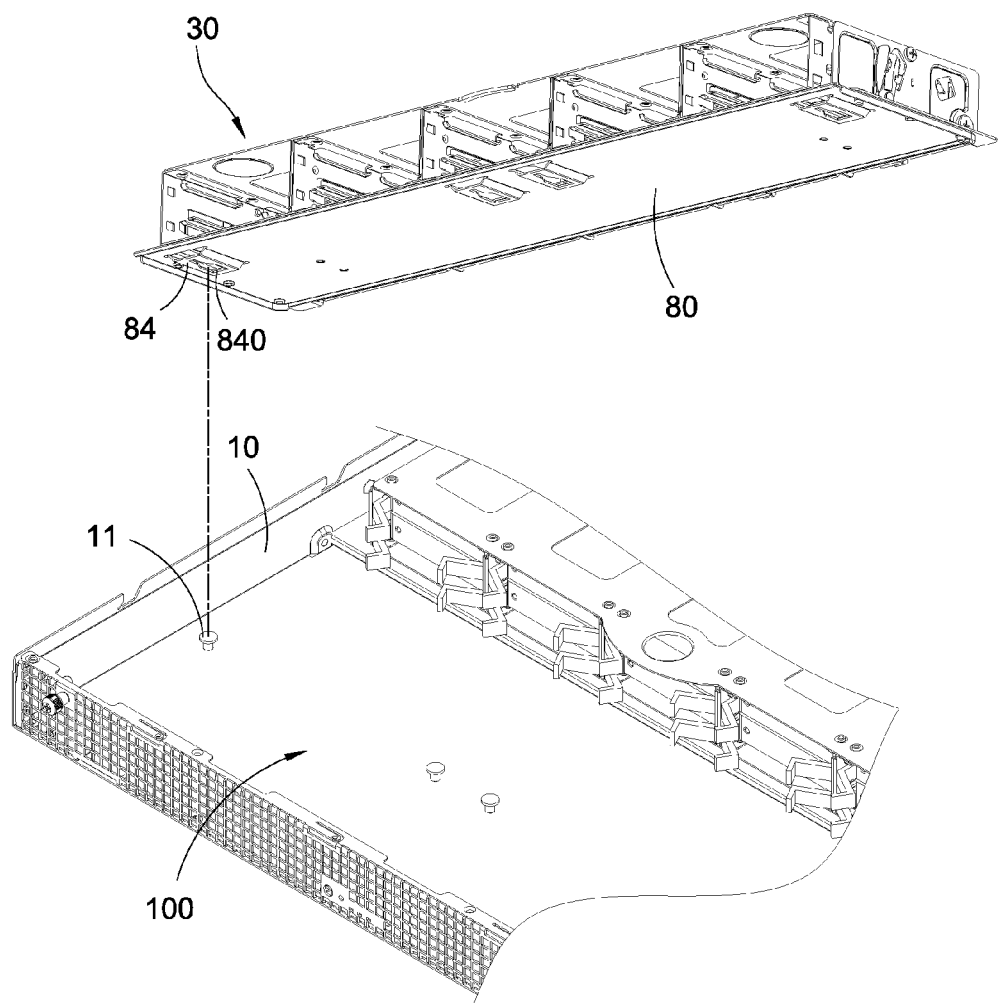
FIG. 7 is an assembled schematic view of the rotatable rack and the casing according to the present invention.

Please further refer to FIG. 7. The bottom plate 80 further can be connected to a buckle seat 84. A convex pillar 11 is provided on a position of the casing 10 corresponding to the buckle seat 84. The rotatable rack 30 can firstly be connected to the bottom plate 80 and further connected to the convex pillar 11 by the buckle seat 84, so as to be assembled into the casing 10. In the present embodiment, the buckle seat 84 has a buckle trough 840 which eventually reduce in size. The convex pillar 11 slides into the buckle trough 840 from a wide side and is positioned in a narrow of the buckle trough 840. By bucking the buckle seat 84 and the convex pillar 11, the rotatable rack 30 can be easily detached from the casing 10 without using any tools. In other words, the rotatable rack 30 can be buckled with the convex pillar 11 by the buckle seat 84 to be detachably assembled into the casing 10.

Figure 8:
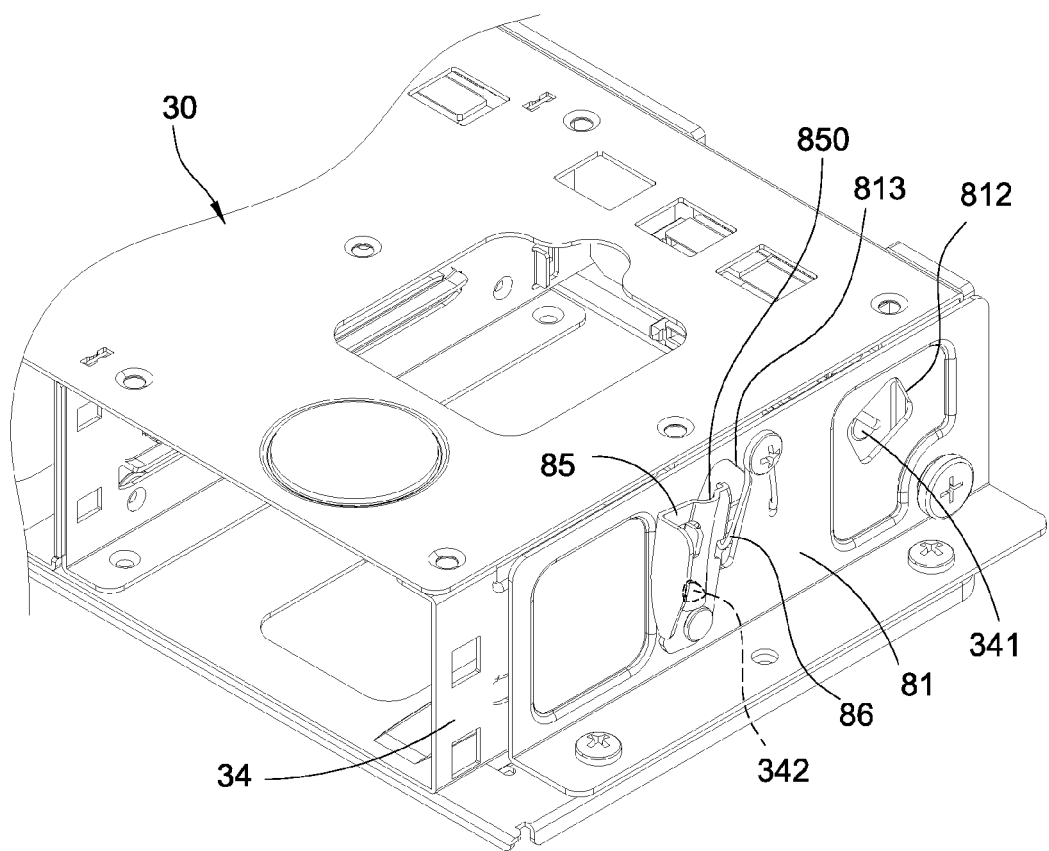
FIG. 8 is an application embodiment of preventing over rotation of the rotatable rack according to the present invention.

Please refer to FIG. 8. In the present embodiment, the rotatable rack 30 includes a side plate 34. The side plate 34 has a block 341 and a sliding block 342. The positions of the support gusset 81 corresponding to the block 341 and the sliding block 342 are provided with a first open trough 812 and a second open trough 813, respectively. Besides, the support gusset 81 further connects to a pressing plate 85 and a spring 86. One side of the pressing plate 85 is pivotally attached to the support gusset 81, and the other side of the pressing plate 85 can rotate with respect to a pivot point. One end of the spring 86 is connected to the support gusset 81, and the other end of the spring 86 is connected to the pressing plate 85. Moreover, the pressing plate 85 has an accommodating trough 850 for the block 341 to slide.

Figure 9:
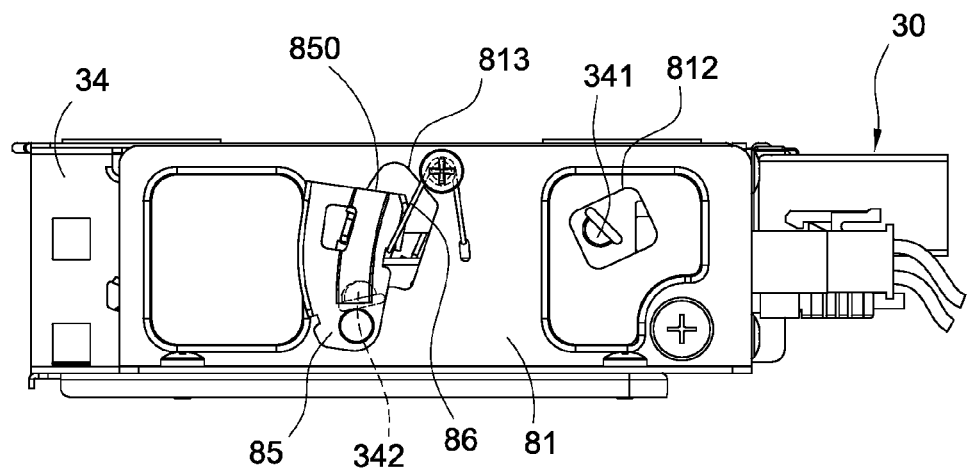
FIG. 9 is a side view of the rotatable rack according to the present invention.
Figure 10:
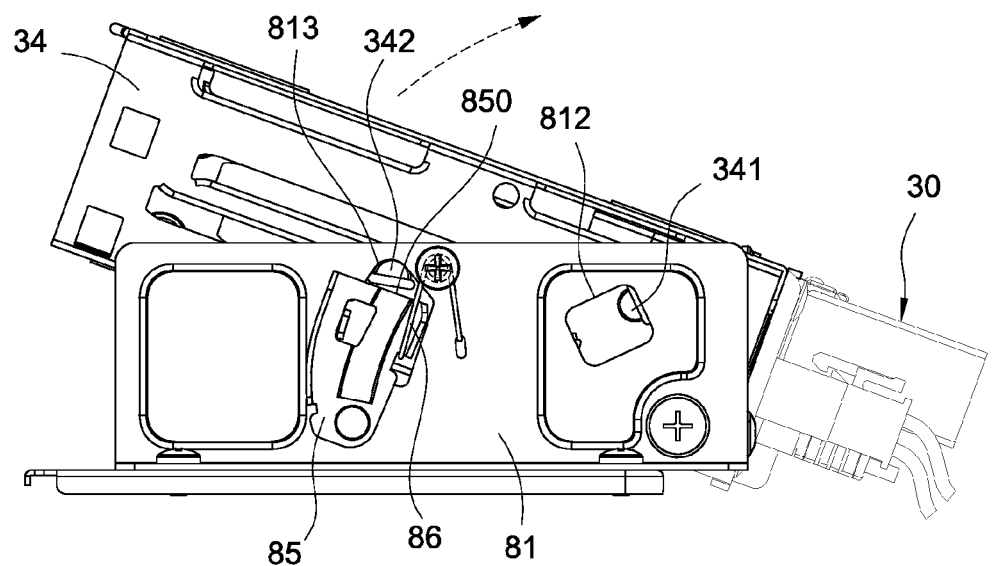
FIG. 10 is a rotation schematic view of the rotatable rack in FIG. 8 according to the present invention.

Please refer to FIGS. 9 and 10. When the rotatable rack 30 does not rotate, the block 341 is situated in the first open trough 812, and the sliding block 342 is situated on the bottom of the accommodating trough 850. Please refer to FIG. 10, when the rotatable rack 30 rotates to a specific angle, the block 341 will be blocked on one side of the first open trough 812 and not be able to rotate any further. Additionally, the sliding block 342 will move along the accommodating trough 850 to block outside the accommodating trough 850. Therefore, after the external force is removed, the rotatable rack 30 can be positioned because the sliding block 342 is blocked outside of the pressing plate 85. By this arrangement, the over rotation of the rotatable rack 30 can be prevented by the setting of the block 341 and the sliding block 342.

Specifically, when the rotatable rack 30 wants to go back to a non-rotation status, the pressing plate 85 needs to be pushed hard, and then the spring 86 connected to the pressing plate 85 will be elastically compressed to release the restriction which the pressing plate 85 applies to the sliding block 342. By this arrangement, the rotatable rack 30 can be brought back to the original position.

Figure 11:
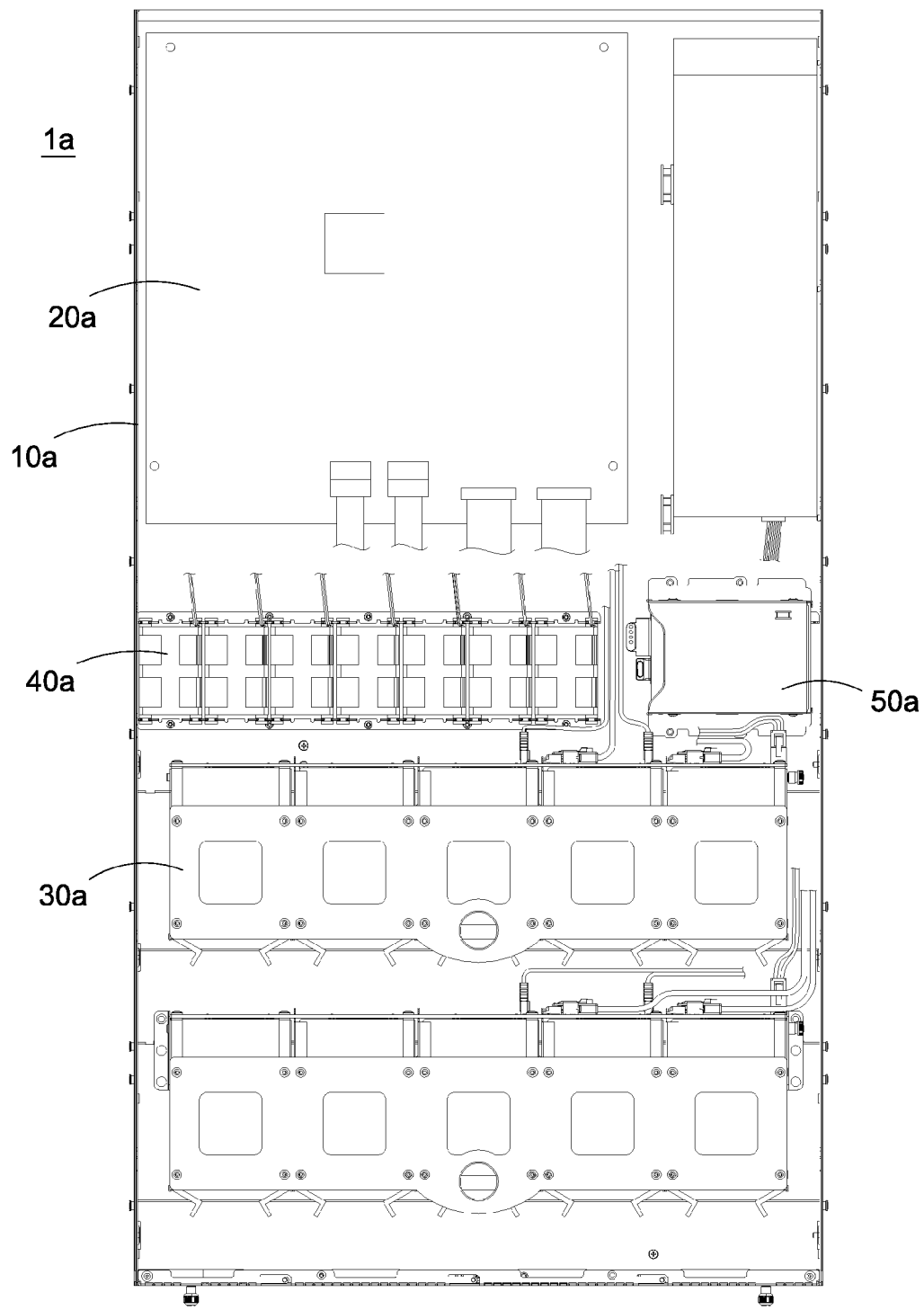
FIG. 11 is another embodiment of the server chassis having the rotatable and accessible storage device according to the present invention.

Please refer to FIG. 11. The present embodiment is proximately the same as the first embodiment. The server chassis 1a includes a casing 10a, a motherboard 20a, a rotatable rack 30a, a fan module 40a, and an electronic device 50a. The rotatable rack 30a can rotate with respect to the casing 10a. The difference of the present embodiment lies in that, the electronic device 50a is provided as a storage device (such as hard disk drive), while other structures are the same as the first embodiment.

Although the present invention has been described with reference to the foregoing preferred embodiments, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. A server chassis having rotatable accessing storage devices accommodated therein, comprising:
   a casing comprising an accommodating space, and a bottom surface of the casing being substantially disposed in a horizontal manner;
   a motherboard substantially disposed in the accommodating space in a horizontal manner and substantially parallel to the bottom surface;
   a power supply module substantially disposed in the accommodating space in a horizontal manner and arranged on a front side of the motherboard, and the power supply module electrically connected to the motherboard;
   a bottom plate substantially disposed in the accommodating space in a horizontal manner and fixed to the bottom surface;
   a rotatable rack rotatable with respect to the bottom plate, two support gussets being disposed on two ends of the rotatable rack, respectively, the rotatable rack having a plurality of sliding tracks, and a plurality of insertion spaces being provided to accommodate multiple storage devices, wherein the plurality of insertion spaces are disposed side by side between the two support gussets, and the insertion spaces are separated and defined by the plurality of sliding tracks;
   a fan module disposed in the accommodating space and electrically connected to the motherboard, the fan module disposed between the rotatable rack and the motherboard, and having opposite air flow openings facing the rotatable rack and the motherboard, respectively; and
   an electronic device disposed in the accommodating space and electrically connected to the motherboard, the electronic device disposed between the motherboard and the rotatable rack, and adjacent to the fan module, a cord passage being provided between the electronic device and the fan module;
   wherein the storage devices disposed in the rotatable rack are electrically connected to the motherboard via the cord passage.

2. The server chassis according to claim 1, wherein the rotatable rack further comprises an input/output backplane; the input/output backplane comprises a plurality of data transferring ports and a power supply port; the power supply port is disposed on the same side of the casing with respect to the power supply module, and the power supply port is electrically connected to the motherboard via the cord passage.

3. The server chassis according to claim 1, wherein a second passage is provided between one side of the rotatable rack and interior wall of the casing; the second passage is provided on the same side of the casing with respect to the power supply module.

4. The server chassis according to claim 3 further comprising a second rotatable rack, wherein the second rotatable rack is disposed on a side of the rotatable rack away from the fan module; the second rotatable rack is electrically connected to the motherboard via the second passage and the cord passage.

5. The server chassis according to claim 1, wherein the plurality of support gussets are disposed on the bottom plate for interconnecting the rotatable rack and the bottom plate, and the rotatable rack is axially disposed on the support gussets.

6. The server chassis according to claim 5, wherein each of the support gussets is provided with a fixing hole, the bottom plate is fixed inside the casing by fixing a plurality of locking members through the fixing holes.

7. The server chassis according to claim 5, wherein the support gusset axially connected to the rotatable rack has a block protruding inwardly toward the rotatable rack; the rotation of the rotatable rack is stopped by the block.

8. The server chassis according to claim 5, wherein the bottom plate is further connected to a buckle seat; a convex pillar is provided on a position of the casing where the casing corresponds to the buckle seat; the rotatable rack is buckled to the convex pillar via the buckle seat and detachably provided inside the casing.

9. The server chassis according to claim 1, wherein the rotatable rack comprises a cover plate, and the cover plate is provided with a holding hole.

10. The server chassis according to claim 1, wherein the electronic device is any one of a fan or a storage device.

* * * * *